United States Patent
Liu et al.

(10) Patent No.: US 10,777,541 B2
(45) Date of Patent: Sep. 15, 2020

(54) MICRO-LED DISPLAY PANEL AND MANUFACTURING METHOD THEREOF

(71) Applicant: PlayNitride Inc., Tainan (TW)

(72) Inventors: Ying-Tsang Liu, Tainan (TW); Yu-Chu Li, Tainan (TW); Pei-Hsin Chen, Tainan (TW); Yi-Ching Chen, Tainan (TW)

(73) Assignee: PlayNitride Inc., Tainan (TW)

( * ) Notice: Subject to any disclaimer, the term of this patent is extended or adjusted under 35 U.S.C. 154(b) by 35 days.

(21) Appl. No.: 16/164,816

(22) Filed: Oct. 19, 2018

(65) Prior Publication Data
US 2019/0131282 A1    May 2, 2019

(30) Foreign Application Priority Data
Oct. 31, 2017    (TW) .............. 106137561 A

(51) Int. Cl.
*H01L 25/16* (2006.01)
*H01L 25/075* (2006.01)
(Continued)

(52) U.S. Cl.
CPC .......... *H01L 25/0753* (2013.01); *H01L 24/32* (2013.01); *H01L 24/81* (2013.01);
(Continued)

(58) Field of Classification Search
CPC ..... H01L 25/0753; H01L 24/95; H01L 24/81; H01L 25/167; H01L 24/83; H01L 24/32; H01L 33/38; H01L 33/62; H01L 33/0093; H01L 2924/10156; H01L 2924/00014; H01L 2224/95001; H01L 2224/1403; H01L 2224/83192; H01L 2224/29298; H01L 2224/73204; H01L 2224/81903; H01L 2224/2929; H01L 24/16;
(Continued)

(56) References Cited

U.S. PATENT DOCUMENTS

2015/0209914 A1* 7/2015 Ishigami ............... C09J 9/02
257/99
2015/0353781 A1* 12/2015 Namiki ............. H01L 33/486
257/98

FOREIGN PATENT DOCUMENTS

CN      103295996      9/2013
CN      103296166      9/2013
(Continued)

*Primary Examiner* — David Vu
(74) *Attorney, Agent, or Firm* — JCIPRNET

(57) ABSTRACT

A micro-LED display panel including a substrate, an anisotropic conductive film, and a plurality of micro-LEDs is provided. The anisotropic conductive film is disposed on the substrate. The micro-LEDs and the anisotropic conductive film are disposed at the same side of the substrate, and the micro-LEDs are electrically connected to the substrate through the anisotropic conductive film. Each of the micro-LEDs includes an epitaxial layer and an electrode layer electrically connected to the epitaxial layer, and the electrode layers comprises a first electrode and a second electrode which are located between the substrate and the corresponding epitaxial layer. A ratio of a thickness of each of the electrode layers to a thickness of the corresponding epitaxial layer ranges from 0.1 to 0.5, and a gap between the first electrode and the second electrode of each of the micro-LEDs is in a range of 1 μm to 30 μm.

17 Claims, 5 Drawing Sheets

(51) Int. Cl.
  *H01L 33/62*   (2010.01)
  *H01L 33/38*   (2010.01)
  *H01L 23/00*   (2006.01)
  *H01L 33/00*   (2010.01)
(52) U.S. Cl.
  CPC .............. *H01L 24/83* (2013.01); *H01L 24/95* (2013.01); *H01L 25/167* (2013.01); *H01L 33/38* (2013.01); *H01L 33/62* (2013.01); *H01L 24/14* (2013.01); *H01L 24/16* (2013.01); *H01L 24/29* (2013.01); *H01L 24/73* (2013.01); *H01L 33/0093* (2020.05); *H01L 2224/1403* (2013.01); *H01L 2224/2929* (2013.01); *H01L 2224/29298* (2013.01); *H01L 2224/32145* (2013.01); *H01L 2224/73204* (2013.01); *H01L 2224/81903* (2013.01); *H01L 2224/83005* (2013.01); *H01L 2224/83192* (2013.01); *H01L 2224/83203* (2013.01); *H01L 2224/83851* (2013.01); *H01L 2224/95001* (2013.01); *H01L 2924/00014* (2013.01); *H01L 2924/10156* (2013.01); *H01L 2924/12041* (2013.01); *H01L 2933/0066* (2013.01)

(58) Field of Classification Search
  CPC ........... H01L 2224/83851; H01L 24/29; H01L 24/73; H01L 24/14; H01L 2224/83005; H01L 2924/12041; H01L 2224/32145; H01L 2224/83203; H01L 2933/0066
  See application file for complete search history.

(56) References Cited

FOREIGN PATENT DOCUMENTS

| | | |
|---|---|---|
| CN | 104617121 | 5/2015 |
| CN | 105789122 | 7/2016 |

* cited by examiner

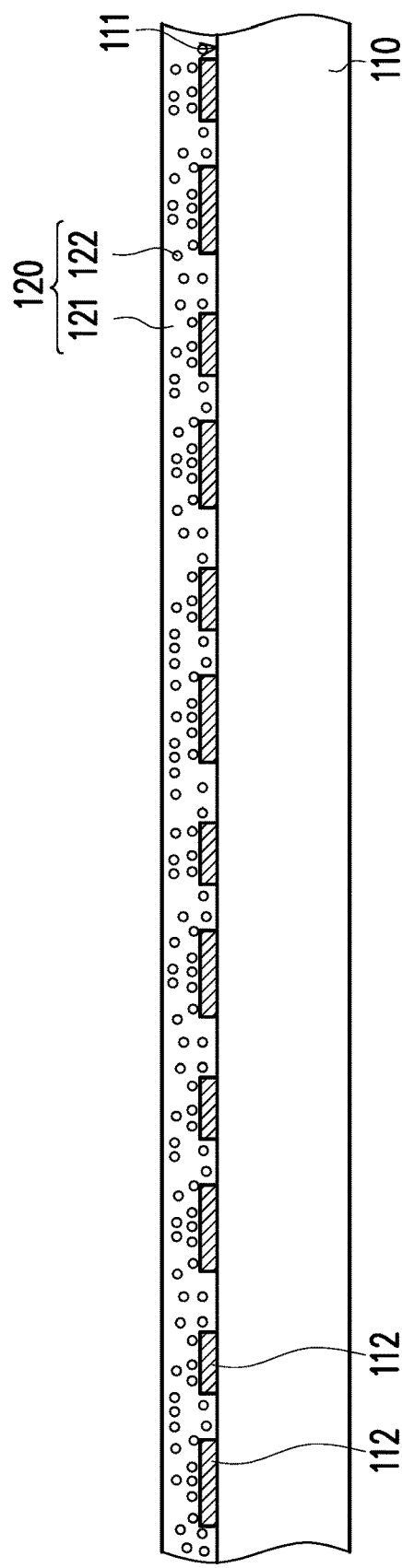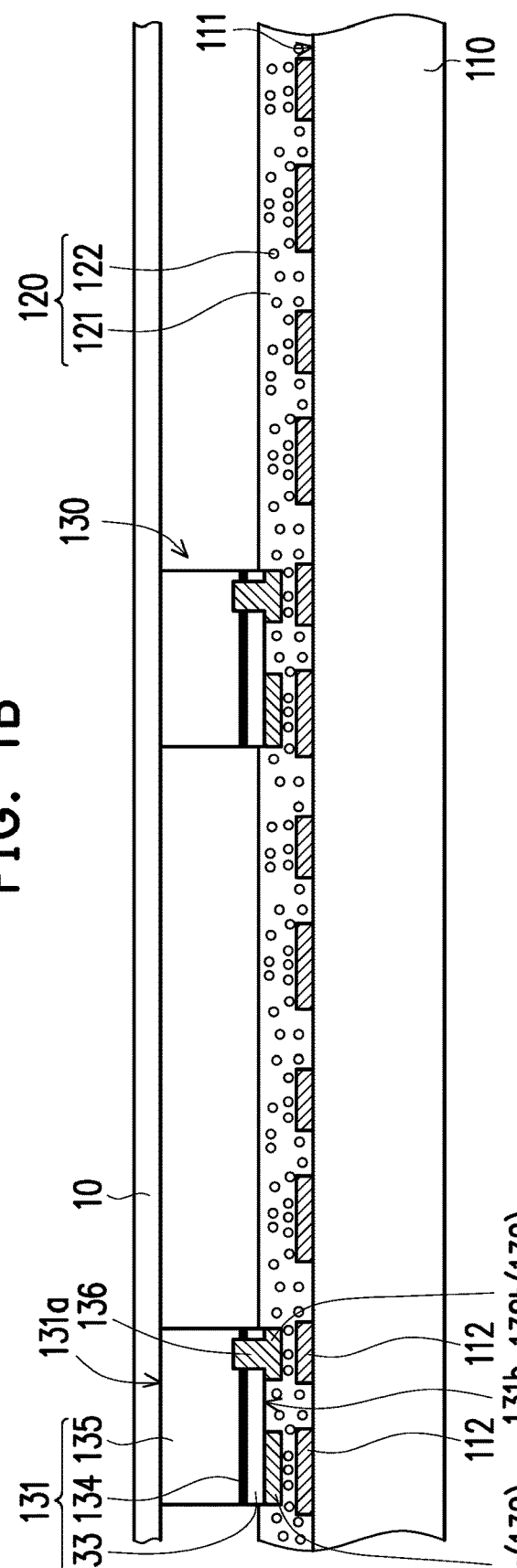

MICRO-LED DISPLAY PANEL AND MANUFACTURING METHOD THEREOF

CROSS-REFERENCE TO RELATED APPLICATION

This application claims the priority benefit of Taiwan application serial no. 106137561, filed on Oct. 31, 2017. The entirety of the above-mentioned patent application is hereby incorporated by reference herein and made a part of this specification.

BACKGROUND OF THE INVENTION

Field of the Invention

The invention relates to a display panel and a manufacturing method thereof, and more particularly relates to a micro-LED (light-emitting diode) display panel and a manufacturing method thereof.

Description of Related Art

Micro-LED displays have advantages not only in low power consumption, high brightness, high color saturation, fast response, and power saving, but also in material stability and image sticking. Therefore, the development of the display technology of micro-LED displays has drawn much attention.

In terms of the manufacturing process, in the process of transferring micro-LEDs from a growth substrate to a driving circuit substrate, it is required to apply heat and pressure to the micro-LEDs, so as to electrically bond the micro-LEDs to the driving circuit substrate. However, in the transfer process, the micro-LEDs may be damaged easily or even break, which impairs the reliability of the micro-LED display obtained in the subsequent processes.

SUMMARY OF THE INVENTION

The invention provides a micro-LED display panel having good reliability.

The invention provides a manufacturing method of a micro-LED display panel for improving product reliability.

A micro-LED display panel according to an embodiment of the invention includes a substrate, an anisotropic conductive film, and a plurality of micro-LEDs. The anisotropic conductive film is disposed on the substrate. The micro-LEDs and the anisotropic conductive film are disposed at the same side of the substrate, and the micro-LEDs are electrically connected to the substrate via the anisotropic conductive film, wherein each of the micro-LEDs includes an epitaxial layer and an electrode layer electrically connected to the epitaxial layer, and the electrode layer comprises a first electrode and a second electrode which are located between the substrate and the epitaxial layer, wherein a ratio of a thickness of each of the electrode layers to a thickness of the corresponding epitaxial layer is in a range of 0.1 to 0.5. A gap between the first electrode and the second electrode of each of the micro-LEDs is in a range of 1 μm to 30 μm.

In an embodiment of the invention, each of the epitaxial layers has a first surface and a second surface opposite to each other, each of the first electrodes and each of the second electrodes are disposed on the corresponding second surface, and each of the second surfaces faces the anisotropic conductive film.

In an embodiment of the invention, a part of the second surface of each of the micro-LEDs is adjacent to the anisotropic conductive film.

In an embodiment of the invention, a part of the second surface of each of the micro-LEDs contacts the anisotropic conductive film.

In an embodiment of the invention, each of the epitaxial layers includes a first type semiconductor layer, a light emitting layer and a second type semiconductor layer, wherein the first type semiconductor layer and the second type semiconductor layer are located at two opposite sides of the light emitting layer, and the light emitting layer connects the first type semiconductor layer and the second type semiconductor layer, wherein each of the first type semiconductor layers has the second surface. Each of the first electrodes is electrically contacted with the corresponding second surface, and each of the second electrodes is electrically contacted with the corresponding second type semiconductor layer via a conductive hole and electrically isolated to the corresponding first type semiconductor layer.

In an embodiment of the invention, a ratio of a depth of one of the conductive holes to the thickness of the corresponding epitaxial layer is in a range of 0.15 to 0.35.

In an embodiment of the invention, a side length of each of the micro-LEDs is in a range of 3 μm to 100 μm.

In an embodiment of the invention, a ratio of the gap between the first electrode and the second electrode of each of the micro-LEDs to the side length of the micro-LED is in a range of 0.1 to 0.25.

In an embodiment of the invention, each of the epitaxial layers comprises a first type semiconductor layer, a second type semiconductor layer, and a light emitting layer connected to and disposed between the first type semiconductor layer and the second type semiconductor layer, wherein the second type semiconductor layer extends beyond the light emitting layer and the first type semiconductor layer in one of the micro-LEDs, the second surface has a first sub-surface and a second sub-surface separated from each other, the first type semiconductor layer has the first sub-surface, and an end of the second type semiconductor layer has the second sub-surface, wherein in one of the micro-LEDs, the first electrode is electrically contacted with the first sub-surface, and the second electrode is electrically contacted with the second sub-surface.

In an embodiment of the invention, the substrate includes a plurality of pads, and the anisotropic conductive film covers the pads, and the electrode layers are electrically bonded to the pads respectively.

In an embodiment of the invention, at least one of the pads has a first thickness and at least another one of the pads has a second thickness, and the second thickness is greater than the first thickness.

In an embodiment of the invention, the anisotropic conductive film comprises an insulation film and a plurality of conductive particles dispersed in the insulation film, wherein a particle size of each of the conductive particles is smaller than the gap between the first electrode and the second electrode of one of the micro-LEDs, and a plurality of bonding layers are formed between the electrode layers and the pads and electrically connect the electrode layers and the pads respectively.

In an embodiment of the invention, at least one of the bonding layers has a first transmittance and at least another one of the bonding layers has a second transmittance, and the second transmittance is greater than the first transmittance.

In an embodiment of the invention, at least one of the bonding layers has a first thickness and at least another one of the bonding layers has a second thickness, and the second thickness is greater than the first thickness.

In an embodiment of the invention, the anisotropic conductive film includes an insulation film and a plurality of conductive particles dispersed in the insulation film, and a ratio of a particle size of each of the conductive particles to a side length of each of the micro-LEDs is in a range of 0.1 to 0.2.

In an embodiment of the invention, the anisotropic conductive film comprises an insulation film and a plurality of conductive particles dispersed in the insulation film, and a particle size of each of the conductive particles is smaller than the gap between the first electrode and the second electrode of each of the micro-LEDs.

In an embodiment of the invention, a distance between one of the micro-LEDs and the substrate is different from a distance between another one of the micro-LEDs and the substrate.

A manufacturing method of a micro-LED display panel according to an embodiment of the invention includes the following: a step (A) of providing a substrate with an anisotropic conductive film; a step (B) of transferring a plurality of micro-LEDs to the substrate and disposing the micro-LEDs on the anisotropic conductive film; a step (C) of repeating the step (B) to dispose a required number of the micro-LEDs on the substrate; and a step (D) of processing by heating and pressuring to electrically bond the micro-LEDs to the substrate.

In an embodiment of the invention, in the step (B), the micro-LEDs are aligned with a plurality of pads of the substrate respectively.

In an embodiment of the invention, in the step (D), a bonding layer is formed between one of the micro-LEDs and one of the pads to electrically connect the one of the micro-LEDs and the substrate.

Based on the above, the micro-LEDs in the micro-LED display panel according to one or some embodiments of the invention are electrically connected to the substrate via the anisotropic conductive film. The anisotropic conductive film may serve as a buffer and therefore is capable of preventing damage or breakage of the micro-LEDs under heat and pressure, and thereby improving the reliability of the micro-LED display panel. In other words, the micro-LED display panel obtained by the manufacturing method of one or some embodiments of the invention has good reliability.

To make the aforementioned and other features and advantages of the invention more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate exemplary embodiments of the invention and, together with the description, serve to explain the principles of the invention.

FIG. 1B to FIG. 1E are partial cross-sectional diagrams showing a manufacturing process of the micro-LED display panel according to the first embodiment of the invention.

DESCRIPTION OF THE EMBODIMENTS

Figure 1A:
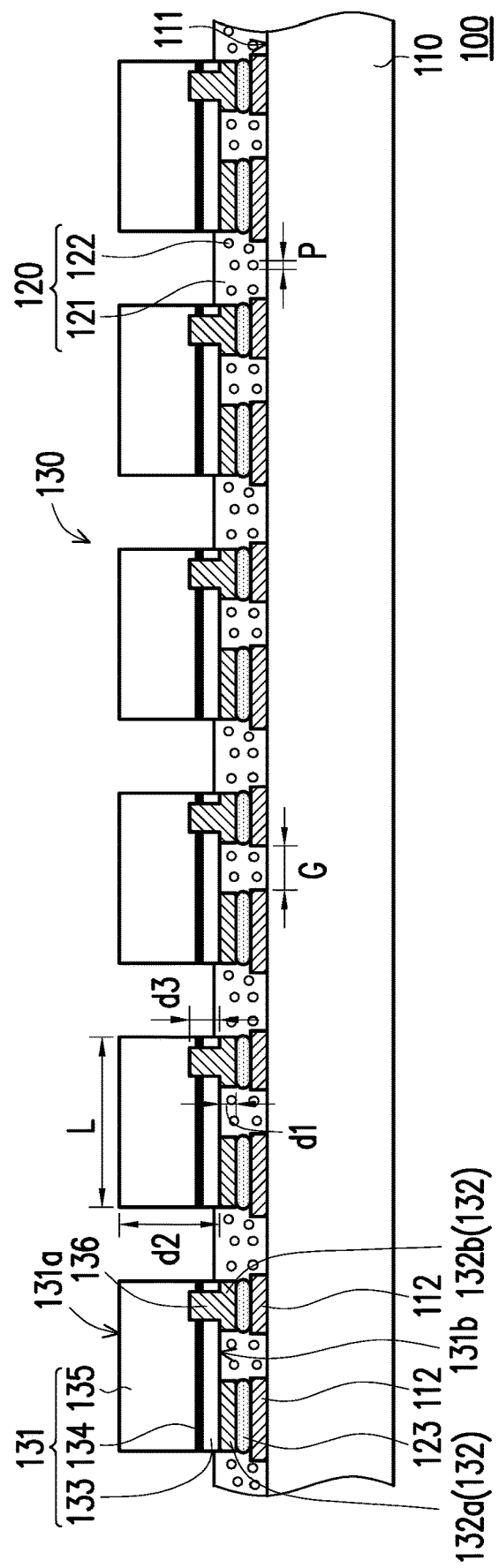
FIG. 1A is a partial cross-sectional diagram of a micro-LED display panel according to the first embodiment of the invention.
Figure 1D:
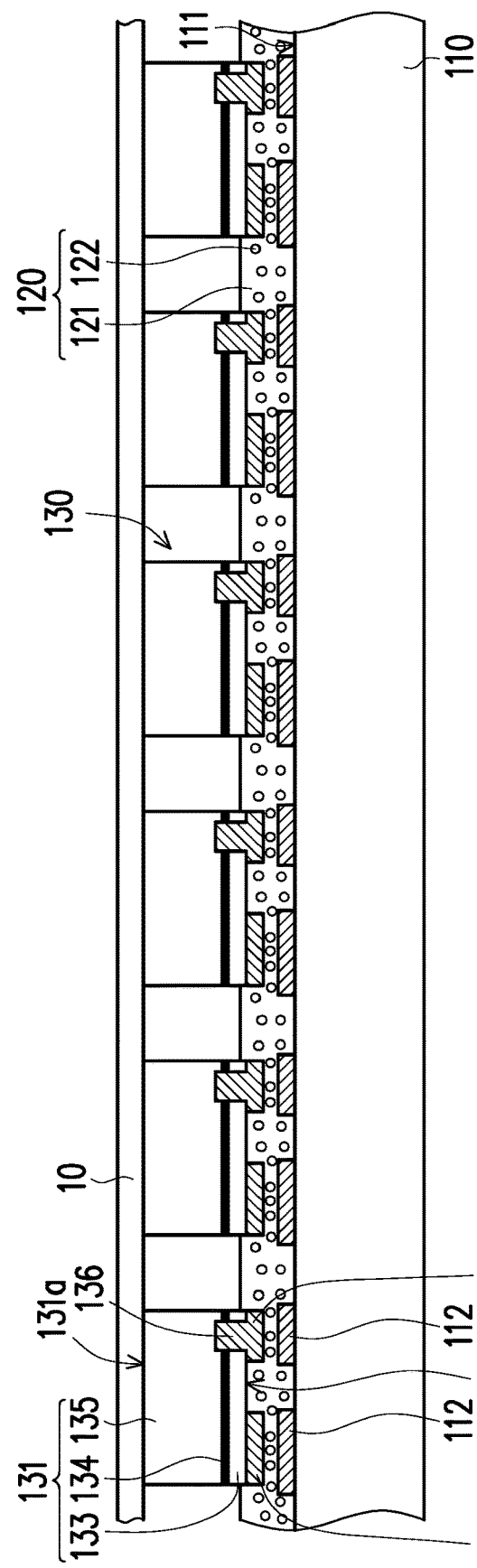

FIG. 1A is a partial cross-sectional diagram of a micro-LED display panel according to the first embodiment of the invention. Referring to FIG. 1, in this embodiment, a micro-LED display panel 100 includes a substrate 110, an anisotropic conductive film 120, and a plurality of micro-LEDs 130, wherein the substrate 110 may be a driving circuit substrate, and a driving circuit (not shown) and a plurality of pads 112 electrically connected to the driving circuit (not shown) are disposed on a surface 111 of the substrate 110.

The anisotropic conductive film 120 is disposed at a side of the substrate 110. That is, the anisotropic conductive film 120 is disposed on the surface 111 of the substrate 110 and covers the pads 112. The anisotropic conductive film 120 includes an insulation film 121 and a plurality of conductive particles 122, wherein the insulation film 120 may be formed of a resin, and the conductive particles 122 are dispersed in the insulation film 121. The micro-LEDs 130 and the anisotropic conductive film 120 are disposed at the same side of the substrate 110. That is, the micro-LEDs 130 and the anisotropic conductive film 120 are both disposed on the surface 111. Based on the properties that the anisotropic conductive film 120 is electrically conductive in a direction perpendicular to the surface 111 and electrically insulative in a direction parallel to the surface 111, the micro-LEDs 130 may be electrically connected to the substrate 110 via the anisotropic conductive film 120, and the micro-LEDs 130 arranged side by side on the surface 111 of the substrate 110 are not electrically conducted with each other to cause a short circuit.

In this embodiment, each micro-LED 130 includes an epitaxial layer 131 and an electrode layer 132 electrically connected to the epitaxial layer 131, and each electrode layer 132 is located between the substrate 110 and the corresponding epitaxial layer 131. As shown in FIG. 1A, each epitaxial layer 131 and the substrate 110 are located at two opposite sides of the anisotropic conductive film 120, and the anisotropic conductive film 120 covers the electrode layer 132. For example, the anisotropic conductive film 120 may completely cover the electrode layer 132 or partially cover the electrode layer 132, and the invention is not intended to limit how the anisotropic conductive film 120 covers the electrode layer 132.

Furthermore, each micro-LED 130 is correspondingly bonded to a pair of pads 112, and each epitaxial layer 131 is aligned with the corresponding pair of pads 112 via the corresponding electrode layer 132, such that the corresponding electrode layer 132 is embedded in the anisotropic conductive film 120. After the electrode layer 132 of each epitaxial layer 131 is electrically conducted with (or electrically bonded to) the corresponding pair of pads 112, each epitaxial layer 131 is electrically connected to the substrate 110. In addition, a ratio of a thickness d1 of each electrode layer 132 to a thickness d2 of the corresponding epitaxial layer 131 is in a range of 0.1 to 0.5. If the thickness d1 of each electrode layer 132 is overly large, the gap between each epitaxial layer 131 and the substrate 110 is increased, and the structural strength of each micro-LED 130 is reduced. On the other hand, if the thickness d1 of each electrode layer 132 is overly small, poor electrical conduction or uneven current distribution may occur.

In this embodiment, each electrode layer 132 includes a first electrode 132a and a second electrode 132b, and each epitaxial layer 131 has a first surface 131a and a second surface 131b opposite to each other. As shown in FIG. 1A, each first electrode 132a and each second electrode 132b (or referred to as the first electrode 132a and the second electrode 132b disposed in pair) are disposed on the corresponding second surface 131b. The first electrode 132a of the first electrode 132a and the second electrode 132b disposed in pair is connected to one pad 112 of the corresponding pair of pads 112, and the second electrode 132b of the first electrode 132a and the second electrode 132b disposed in pair is connected to the other pad 112 of the corresponding pair of pads 112. Each second surface 131b faces and contacts the anisotropic conductive film 120 (or faces the surface 111 of the substrate 110), such that each first electrode 132a and each second electrode 132b are embedded in the anisotropic conductive film 120. In other words, each first surface 131a faces away from the anisotropic conductive film 120 (or faces away from the surface 111 of the substrate 110).

In addition, each epitaxial layer 131 includes a first type semiconductor layer 133, a light emitting layer 134, and a second type semiconductor layer 135, wherein each first type semiconductor layer 133 and the corresponding second type semiconductor layer 135 are located at two opposite sides of the corresponding light emitting layer 134, and each light emitting layer 134 connects the corresponding first type semiconductor layer 133 and the corresponding second type semiconductor layer 135. Furthermore, each first type semiconductor layer 133 has the second surface 131b. Each first electrode 132a is electrically contacted with the corresponding second surface 131b, and each second electrode 132b is electrically contacted with the corresponding second type semiconductor layer 135 via a conductive hole 136 and electrically isolated to the corresponding first type semiconductor layer 133. For example, the anisotropic conductive film 120 may further cover a side surface of the first type semiconductor layer 133, but the invention is not limited thereto. In other embodiments, the anisotropic conductive film may completely cover the electrode layer, and a top surface of the anisotropic conductive film is flush with the second surface (i.e., the surface that faces the substrate) of each first type semiconductor layer, for example, or the top surface of the anisotropic conductive film is separated from the second surface (i.e., the surface that faces the substrate) of each first type semiconductor layer by a distance and partially covers the electrode layer.

In this embodiment, a ratio of a depth d3 of each conductive hole 136 to the thickness d2 of the corresponding epitaxial layer 131 is in a range of 0.15 to 0.35, wherein the depth d3 of each conductive hole 136 is calculated from the second surface 131b of the corresponding first type semiconductor layer 133 to an end of each conductive hole 136 that penetrates the corresponding second type semiconductor layer 135. If the depth d3 of each conductive hole 136 is overly small, the current distribution becomes uneven and the current does not flow from the second electrode 132b to the second type semiconductor layer 135 easily. On the other hand, if the depth d3 of each conductive hole 136 is overly large, the epitaxial layer 131 may break easily under pressure.

In this embodiment, a side length L of each micro-LED 130 is in a range of 3 μm to 100 μm, and a gap G between the first electrode 132a and the second electrode 132b of each micro-LED 130 is in a range of 1 μm to 30 μm. Furthermore, a ratio of the gap G between the first electrode 132a and the second electrode 132b of each micro-LED 130 to the side length L of the corresponding micro-LED 130 is in a range of 0.1 to 0.25. If the gap G is overly small, a short circuit may occur between the first electrode 132a and the second electrode 132b of each micro-LED 130 due to bonding of the conductive particles 122. If the gap G is overly large, the area of the first electrode 132a and the area of the second electrode 132b of each micro-LED 130 are reduced, which makes it difficult to align the first electrode 132a and the second electrode 132b of each micro-LED 130 with the corresponding pair of pads 112 and results in drop of the bonding yield between the first electrode 132a and the second electrode 132b of each micro-LED and the corresponding pair of pads 112.

Furthermore, a particle size P of each conductive particle 122 is smaller than the gap G between the first electrode 132a and the second electrode 132b of each micro-LED 130, and when the anisotropic conductive film 120 is under pressure, a portion of the conductive particles 122 in the insulation film 121 between each electrode layer 132 and the corresponding pair of pads 112 form a bonding layer 123, wherein each bonding layer 123 is configured to electrically connect the corresponding electrode layer 132 and one pair of pads 112. In addition, a ratio of the particle size P of each conductive particle 122 to the side length L of each micro-LED 130 is in a range of 0.1 to 0.2.

Under the circumstances that the particle size P of each conductive particle 122 is smaller than the gap G between the first electrode 132a and the second electrode 132b of each micro-LED 130, and the ratio of the particle size P of each conductive particle 122 to the side length L of each micro-LED 130 is in a range of 0.1 to 0.2, electrical conduction between each electrode layer 132 and the corresponding pair of pads 112 in the direction perpendicular to the surface 111 may be ensured, and a short circuit between the first electrode 132a and the second electrode 132b of each micro-LED 130 due to bonding of the conductive particles 122 may be prevented (that is, the conductive particles 122 located between the first electrode 132a and the second electrode 132b of each micro-LED 130 do not cause electrical conduction between the first electrode 132a and the second electrode 132b in the direction parallel to the surface 111).

Referring to FIG. 1A again, in this embodiment, the micro-LEDs 130 may include red light micro-LEDs, green light micro-LEDs, and blue light micro-LEDs, wherein the red light micro-LEDs, the green light micro-LEDs, and the blue light micro-LEDs may be arranged repeatedly in this order along the direction parallel to the surface 111 of the substrate 110. However, the order of the red light micro-LEDs, the green light micro-LEDs, and the blue light micro-LEDs is not limited to the above and may be adjusted according to the requirements of the design.

In the process of transferring the red light micro-LEDs, the green light micro-LEDs, and the blue light micro-LEDs in batches to the substrate 110, and applying heat and pressure to the red light micro-LEDs, the green light micro-LEDs, and the blue light micro-LEDs transferred to the substrate 110 and the anisotropic conductive film 120 on the substrate 110, the insulation film 121 is cured by the heat, so as to fix the red light micro-LEDs, the green light micro-LEDs, and the blue light micro-LEDs to the substrate 110, and the pressure causes a portion of the conductive particles 122 in the insulation film 121 to form the bonding layer 123, so as to electrically connect the red light micro-LEDs, the green light micro-LEDs, and the blue light micro-LEDs to the substrate 110.

In the process of applying the heat and pressure to the red light micro-LEDs, the green light micro-LEDs, and the blue light micro-LEDs, the anisotropic conductive film 120 may serve as a buffer and therefore is capable of preventing damage or breakage of the red light micro-LEDs, the green light micro-LEDs, and the blue light micro-LEDs, and thereby improving the reliability of the micro-LED display panel 100. Since the red light micro-LEDs, the green light micro-LEDs, and the blue light micro-LEDs are transferred to the substrate 110 in batches, the micro-LEDs 130 that are transferred to the substrate 110 first are pressed most and the bonding layer 123 under the micro-LEDs 130 that are pressed most has the lowest transmittance. That is, the conductive particles 122 under the micro-LEDs 130 that are pressed most are pressed most closely.

For example, the bonding layer 123 for electrically bonding the red light micro-LEDs and the substrate 110 has a first transmittance, the bonding layer 123 for electrically bonding the green light micro-LEDs and the substrate 110 has a second transmittance, and the bonding layer 123 for electrically bonding the blue light micro-LEDs and the substrate 110 has a third transmittance. If the red light micro-LEDs are pressed most, the green light micro-LEDs are pressed second most, and the blue light micro-LEDs are pressed least, the third transmittance is greater than the second transmittance, and the second transmittance is greater than the first transmittance. On the other hand, the electrical conductivity of the bonding layer 123 having the greater transmittance is lower than the electrical conductivity of the bonding layer 123 having the smaller transmittance.

Several processes for transferring the micro-LEDs 130 to the substrate 110 and electrically connecting the micro-LEDs 130 to the substrate 110 are described hereinafter as examples.

FIG. 1B to FIG. 1E are partial cross-sectional diagrams showing a manufacturing process of the micro-LED display panel according to the first embodiment of the invention. Take the first manufacturing process as an example, referring to FIG. 1B, first, Step (A) is performed to provide the substrate 110 with the anisotropic conductive film 120 disposed thereon, wherein the anisotropic conductive film 120 covers the surface 111 of the substrate 110 and the pads 112 located on the surface 111. Next, referring to FIG. 1C, Step (B) is performed to transfer the micro-LEDs 130 on one growth substrate (not shown, referred to as first growth substrate hereinafter) to the substrate 110 via a transfer component 10 and dispose the micro-LEDs 130 on the anisotropic conductive film 120. At this time, the electrode layers 132 of the micro-LEDs 130 are disposed to be aligned with the pads 112 on the substrate 110, and the micro-LEDs 130 are embedded in the anisotropic conductive film 120 to be pre-fixed to the substrate 110 by adhesion, and then the transfer component 10 is removed. In another embodiment, the micro-LEDs 130 may not be embedded in the anisotropic conductive film 120 and may be attached to a surface of the anisotropic conductive film 120. Then, Step (C) is performed, referring to FIG. 1D. That is, Step (B) is repeated to transfer the micro-LEDs 130 on another growth substrate (not shown) to the substrate 110, or transfer other micro-LEDs 130 on the first growth substrate (not shown), which have not been transferred, to the substrate 110, so as to dispose a required number of micro-LEDs 130 on the substrate 110.

Figure 1E:
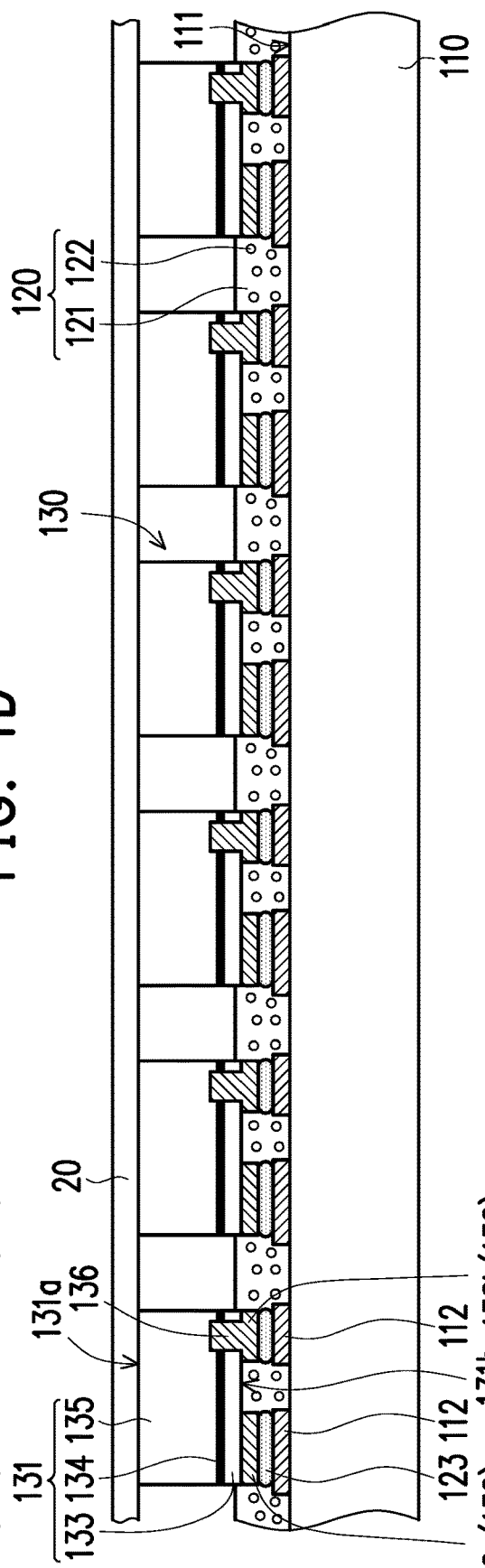

After transferring all the micro-LEDs 130 required for the substrate 110, Step (D) is performed, referring to FIG. 1E, to apply heat and pressure to the micro-LEDs 130 on the anisotropic conductive film 120 via a heating and pressurizing component 20, such that the anisotropic conductive film 120 between each electrode layer and the corresponding pair of pads 112 forms the bonding layer 123, so as to electrically connect each electrode layer and the corresponding pair of pads 112. For example, in Step (D), the value of the pressure applied is about 5 MPa to 40 MPa, the value of the temperature applied is about 100° C. to 200° C., and the time of applying the heat and pressure is about 0.5 seconds to 2 seconds. The heat and pressure may break the conductive particles 122 in the anisotropic conductive film 120 to form the vertically conductive bonding layer 123. At last, the micro-LED display panel 100 as shown in FIG. 1A is obtained. Since the micro-LEDs 130 and the substrate 110 are electrically connected, the micro-LEDs 130 may be controlled by the substrate 110 to emit light, so as to display images. It should be noted that the heating and pressurizing component 20 and the transfer component 10 may be the same device, but in this embodiment, the heating and pressurizing component 20 and the transfer component 10 are different machines.

In addition, the second bonding process is provided as an example. First, the substrate 110 with the anisotropic conductive film 120 disposed thereon is provided, and then the micro-LEDs 130 on one growth substrate (not shown, referred to as first growth substrate hereinafter) are transferred to the substrate 110 with the anisotropic conductive film 120 disposed thereon via the transfer component (not shown). Specifically, the electrode layers 132 of the micro-LEDs 130 on the transfer component (not shown) are disposed to be aligned with the pads 112 on the substrate 110, and heat and pressure are applied to the micro-LEDs 130 transferred to the substrate 110 and the anisotropic conductive film 120 disposed on the substrate 110, so as to electrically connect the micro-LEDs 130 and the substrate 110. Thereafter, the steps described above are repeated to transfer the micro-LEDs 130 on another growth substrate (not shown) to the substrate 110 with the anisotropic conductive film 120 disposed thereon, or transfer other micro-LEDs 130 on the first growth substrate (not shown), which have not been transferred, to the substrate 110 with the anisotropic conductive film 120 disposed thereon, and then the step of applying heat and pressure is performed to electrically connect the micro-LEDs 130 and the substrate 110.

Take the third manufacturing process as an example, the micro-LEDs 130 on one growth substrate (not shown, referred to as first growth substrate hereinafter) are transferred to a temporary carrier (not shown) via the transfer component (not shown). Then, the steps described above are repeated to transfer the micro-LEDs 130 on another growth substrate (not shown) to the temporary carrier (not shown) or transfer other micro-LEDs 130 on the first growth substrate (not shown), which have not been transferred, to the temporary carrier (not shown). After completing the step of transferring the micro-LEDs 130 on multiple growth substrates (not shown) to the temporary carrier (not shown), the micro-LEDs 130 on the temporary carrier (not shown) are transferred to the substrate 110 with the anisotropic conductive film 120 disposed thereon. After aligning the electrode layers 132 of the micro-LEDs 130 with the pads 112 on the substrate 110, the step of applying heat and pressure is performed to electrically connect the micro-LEDs 130 and the substrate 110.

Provided below are some other exemplary embodiments. It should be noted that reference numerals and some descriptions provided in the previous embodiment also apply to the following embodiment. The same reference numerals are presented to denote identical or similar components in the embodiments, and repetitive descriptions are omitted. The omitted descriptions may be found in the previous exemplary embodiment, and thus will not be repeated hereinafter.

Figure 2:
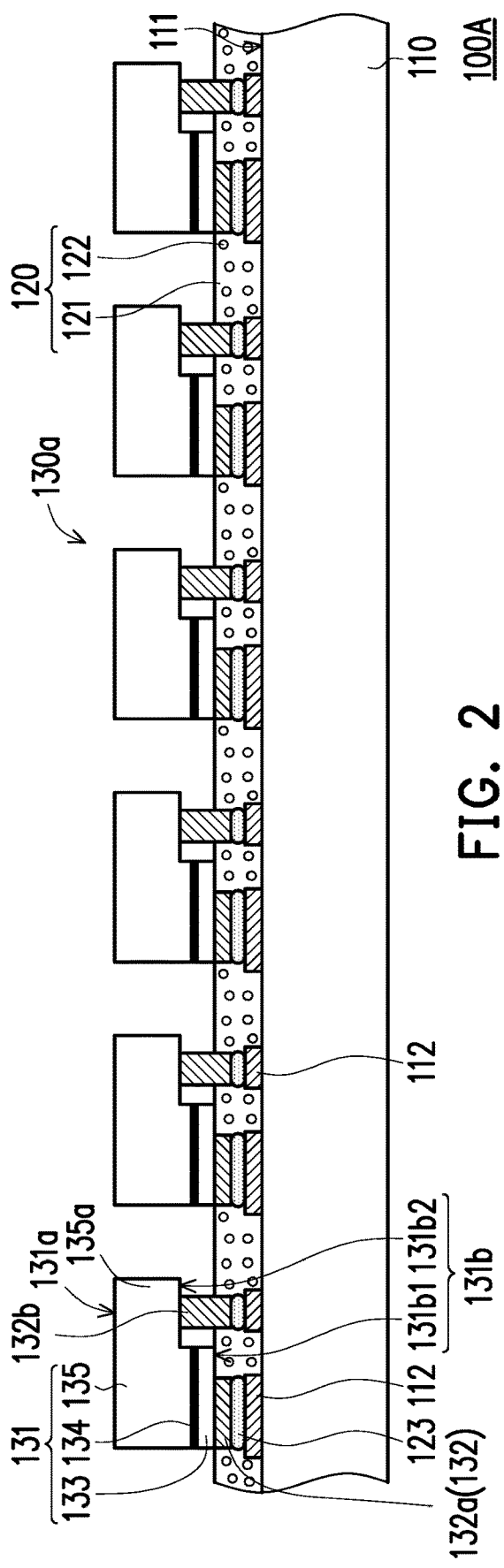
FIG. 2 is a partial cross-sectional diagram of a micro-LED display panel according to the second embodiment of the invention.

FIG. 2 is a partial cross-sectional diagram of a micro-LED display panel according to the second embodiment of the invention. Referring to FIG. 2, a micro-LED display panel 100A of this embodiment is similar to the micro-LED display panel 100 of the first embodiment, and a main difference lies in that: an end 135a of the second type semiconductor layer 135 of each micro-LED 130a extends beyond the corresponding light emitting layer 134 and the corresponding first type semiconductor layer 133, wherein the second surface 131b of each epitaxial layer 131 has a first sub-surface 131b1 and a second sub-surface 131b2 separated from each other, and a height difference exists between each first sub-surface 131b1 and the corresponding second sub-surface 131b2. Furthermore, the first sub-surface 131b1 and the second sub-surface 131b2 both face the surface 111 of the substrate 110.

As shown in FIG. 2, each first sub-surface 131b1 is closer to the surface 111 of the substrate 110 than the corresponding second sub-surface 131b2. Furthermore, each first type semiconductor layer 133 has the first sub-surface 131b1, and the end 135a of each second type semiconductor layer 135 has the second sub-surface 131b2, wherein each first electrode 132a is electrically contacted with the corresponding first sub-surface 131b1, and each second electrode 132b is electrically contacted with the corresponding second sub-surface 131b2. In this embodiment, each second electrode 132b may be a columnar conductive pattern (e.g., a conductive pillar), wherein each second electrode 132b is partially embedded in the anisotropic conductive film 120, and a gap is formed between each second sub-surface 131b2 and the anisotropic conductive film 120. That is, the second sub-surface 131b2 is not contacted with the anisotropic conductive film 120.

Figure 3:
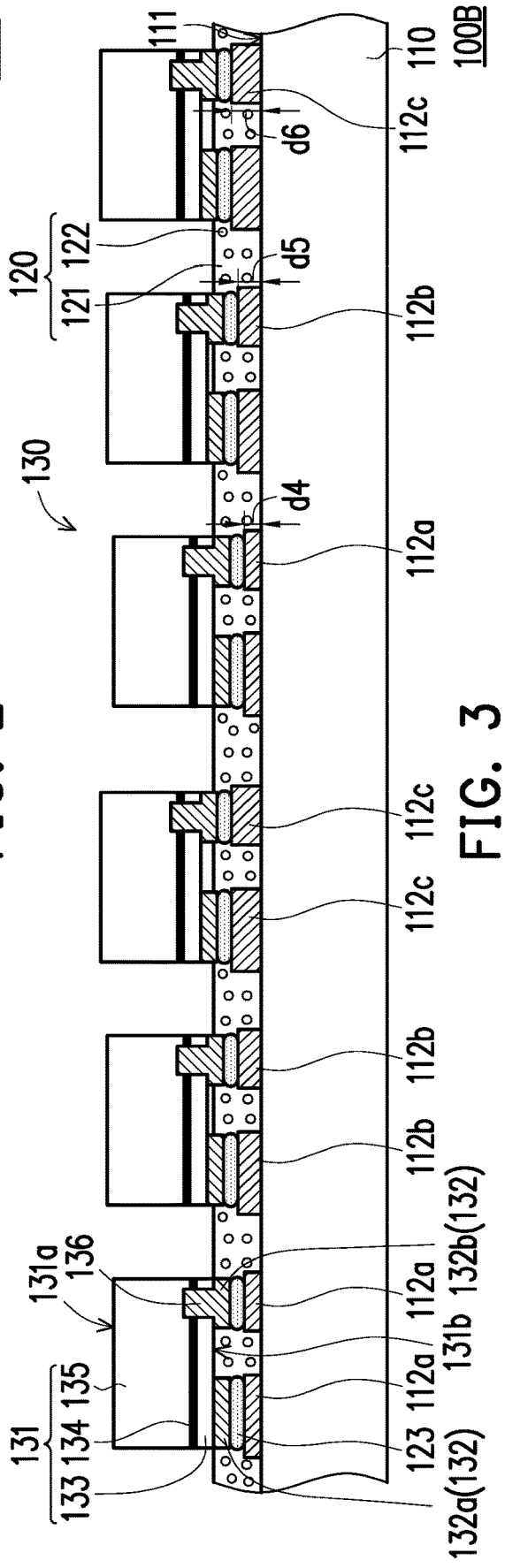
FIG. 3 is a partial cross-sectional diagram of a micro-LED display panel according to the third embodiment of the invention.

FIG. 3 is a partial cross-sectional diagram of a micro-LED display panel according to the third embodiment of the invention. Referring to FIG. 3, a difference between a micro-LED display panel 100B of this embodiment and the micro-LED display panel 100 of the first embodiment lies in that: in this embodiment, a pair of pads 112a having a first thickness d4, a pair of pads 112b having a second thickness d5, and a pair of pads 112c having a third thickness d6 are arranged repeatedly in this order on the surface 111 of the substrate 110, wherein the first thickness d4 is smaller than the second thickness d5, and the second thickness d5 is smaller than the third thickness d6. Based on the thickness design of the pairs of pads 112a to 112c, the micro-LEDs 130 that are transferred to the substrate 110 first are bonded to one pair of pads having the smaller thickness, and when other micro-LEDs 130 are transferred to the substrate 110 in the subsequent processes, the other micro-LEDs 130 are bonded to one pair of pads having the larger thickness, so as to prevent the micro-LEDs 130 that have been transferred to the substrate 110 from being pressed repeatedly.

As shown in FIG. 3, the first surface 131a of the micro-LED 130 electrically bonded to the substrate 110 via the pad 112a is lower than the first surface 131a of the micro-LED 130 electrically bonded to the substrate 110 via the pad 112b, and the first surface 131a of the micro-LED 130 electrically bonded to the substrate 110 via the pad 112b is lower than the first surface 131a of the micro-LED 130 electrically bonded to the substrate 110 via the pad 112c. In other words, a distance between the second surface 131b of the micro-LED 130 electrically bonded to the substrate 110 via the pad 112a and the surface 111 of the substrate 110 is smaller than a distance between the second surface 131b of the micro-LED 130 electrically bonded to the substrate 110 via the pad 112b and the surface 111 of the substrate 110, and a distance between the second surface 131b of the micro-LED 130 electrically bonded to the substrate 110 via the pad 112b and the surface 111 of the substrate 110 is smaller than a distance between the second surface 131b of the micro-LED 130 electrically bonded to the substrate 110 via the pad 112c and the surface 111 of the substrate 110. Besides, a part of the second surface 131b of each of the micro-LEDs 130 is adjacent to anisotropic conductive film 120.

Figure 4:
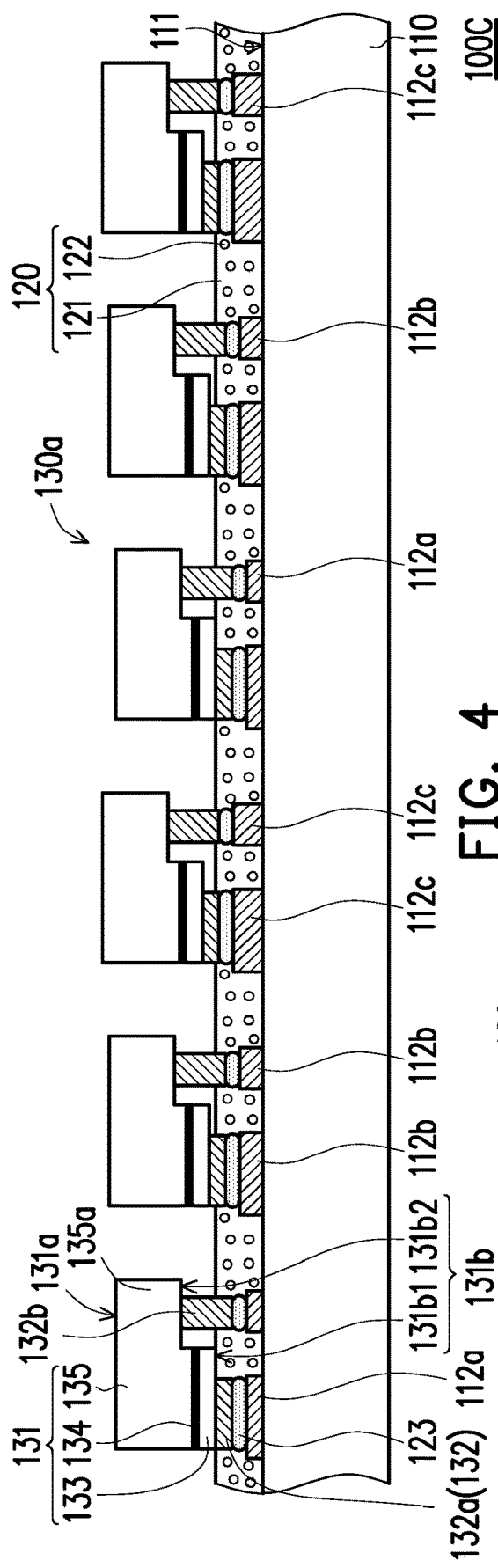
FIG. 4 is a partial cross-sectional diagram of a micro-LED display panel according to the fourth embodiment of the invention.

FIG. 4 is a partial cross-sectional diagram of a micro-LED display panel according to the fourth embodiment of the invention. Referring to FIG. 4, a difference between a micro-LED display panel 100C of this embodiment and the micro-LED display panel 100A of the second embodiment lies in that: in this embodiment, a pair of pads 112a having a first thickness d4, a pair of pads 112b having a second thickness d5, and a pair of pads 112c having a third thickness d6 are arranged repeatedly in this order on the surface 111 of the substrate 110, wherein the first thickness d4 is smaller than the second thickness d5, and the second thickness d5 is smaller than the third thickness d6. Based on the thickness design of the pairs of pads 112a to 112c, the micro-LEDs 130 that are transferred to the substrate 110 first are bonded to one pair of pads having the smaller thickness, and when other micro-LEDs 130 are transferred to the substrate 110 in the subsequent processes, the other micro-LEDs 130 are bonded to one pair of pads having the larger thickness, so as to prevent the micro-LEDs 130 that have been transferred to the substrate 110 from being pressed repeatedly.

As shown in FIG. 4, the first surface 131a of the micro-LED 130a electrically bonded to the substrate 110 via the pad 112a is lower than the first surface 131a of the micro-LED 130a electrically bonded to the substrate 110 via the pad 112b, and the first surface 131a of the micro-LED 130a electrically bonded to the substrate 110 via the pad 112b is lower than the first surface 131a of the micro-LED 130a electrically bonded to the substrate 110 via the pad 112c. In other words, a distance between the second surface 131b of the micro-LED 130a electrically bonded to the substrate 110 via the pad 112a and the surface 111 of the substrate 110 is smaller than a distance between the second surface 131b of the micro-LED 130a electrically bonded to the substrate 110 via the pad 112b and the surface 111 of the substrate 110, and a distance between the second surface 131b of the micro-LED 130a electrically bonded to the substrate 110 via the pad 112b and the surface 111 of the substrate 110 is smaller than a distance between the second surface 131b of the micro-LED 130a electrically bonded to the substrate 110 via the pad 112c and the surface 111 of the substrate 110.

Figure 5:
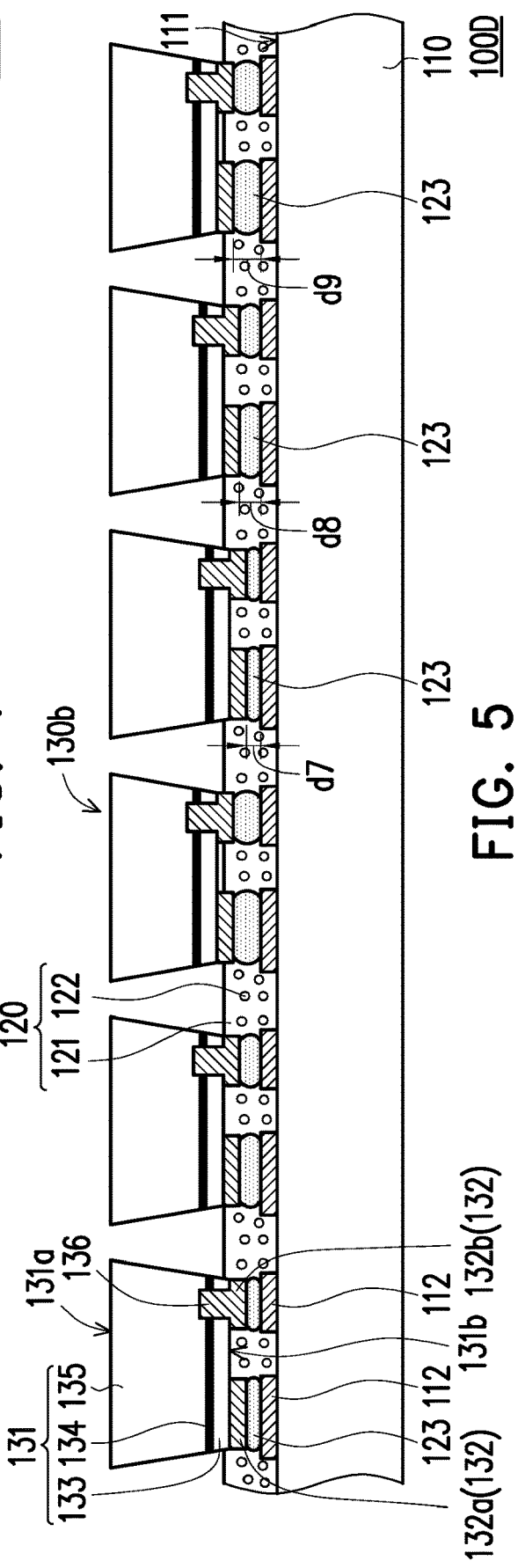
FIG. 5 is a partial cross-sectional diagram of a micro-LED display panel according to the fifth embodiment of the invention.

FIG. 5 is a partial cross-sectional diagram of a micro-LED display panel according to the fifth embodiment of the invention. Referring to FIG. 5, a difference between a micro-LED display panel 100D of this embodiment and the micro-LED display panels 100A to 100C of the embodiments described above lies in that: in this embodiment, the bonding layer 132 has at least two different thicknesses, and for example, a cross-sectional shape of the micro-LED 130b is an inverted trapezoidal shape, and the micro-LEDs 130b may include red light micro-LEDs, green light micro-LEDs, and blue light micro-LEDs, wherein a thickness of the red light micro-LED is greater than a thickness of the green light micro-LED, and the thickness of the green light micro-LED is greater than a thickness of the blue light micro-LED, for example. Nevertheless, the invention is not intended to limit the red light micro-LED, the green light micro-LED, and the blue light micro-LED to certain cross-sectional shapes, nor limit the thickness ratio of the red light micro-LED, the green light micro-LED, and the blue light micro-LED.

Moreover, the bonding layer 123 for electrically bonding the red light micro-LED and the substrate 110 has a thickness d7, the bonding layer 123 for electrically bonding the green light micro-LED and the substrate 110 has a thickness d8, and the bonding layer 123 for electrically bonding the blue light micro-LED and the substrate 110 has a thickness d9, wherein the thickness d9 is greater than the thickness d8, and the thickness d8 is greater than the thickness d7. Therefore, a distance between the second surface 131b of the red light micro-LED that faces the surface 111 of the substrate 110 and the surface 111 of the substrate 110 is smaller than a distance between the second surface 131b of the green light micro-LED that faces the surface 111 of the substrate 110 and the surface 111 of the substrate 110, and a distance between the second surface 131b of the green light micro-LED that faces the surface 111 of the substrate 110 and the surface 111 of the substrate 110 is smaller than a distance between the second surface 131b of the blue light micro-LED that faces the surface 111 of the substrate 110 and the surface 111 of the substrate 110. Moreover, the first surface 131a of the red light micro-LED that faces away from the surface 111 of the substrate 110, the first surface 131a of the green light micro-LED that faces away from the surface 111 of the substrate 110, and the first surface 131a of the blue light micro-LED that faces away from the surface 111 of the substrate 110 are flush with one another.

In other words, the height difference between the surface of the micro-LED, which faces away from the substrate, and the substrate may be controlled by adjusting the thickness of the micro-LED, the thickness of the bonding layer, or the thickness of the pad on the substrate, and the distance between the surface of the micro-LED, which faces the substrate, and the substrate may be controlled by adjusting the thickness of the bonding layer or the thickness of the pad on the substrate.

To sum up, the micro-LEDs in the micro-LED display panel according to one or some embodiments of the invention are electrically connected to the substrate via the anisotropic conductive film. The anisotropic conductive film may serve as a buffer and therefore is capable of preventing damage or breakage of the micro-LEDs under heat and pressure, and thereby improving the reliability of the micro-LED display panel. In other words, the micro-LED display panel obtained by the manufacturing method of one or some embodiments of the invention has good reliability. Furthermore, the insulation film in the anisotropic conductive film is cured under heat so as to fix the micro-LEDs to the substrate and keep the micro-LEDs from coming off the substrate. Moreover, a portion of the conductive particles in the insulation film are pressed to form the bonding layer so as to electrically connect the micro-LEDs to the substrate. Based on the properties that the anisotropic conductive film is electrically conductive in the direction perpendicular to the surface (i.e., the surface of the substrate with the anisotropic conductive film disposed thereon) and electrically insulative in the direction parallel to the surface (i.e., the surface of the substrate with the anisotropic conductive film disposed thereon), the micro-LEDs may be electrically connected to the substrate via the anisotropic conductive film, while the micro-LEDs arranged side by side on the surface (i.e., the surface of the substrate with the anisotropic conductive film disposed thereon) are not electrically conducted with each other to cause a short circuit.

It will be apparent to those skilled in the art that various modifications and variations can be made to the disclosed embodiments without departing from the scope or spirit of the invention. In view of the foregoing, it is intended that the invention covers modifications and variations provided that they fall within the scope of the following claims and their equivalents.

What is claimed is:

1. A micro-LED display panel, comprising:
   a substrate;
   an anisotropic conductive film, disposed on the substrate; and
   a plurality of micro-LEDs, wherein the micro-LEDs and the anisotropic conductive film are disposed at the same side of the substrate, and the micro-LEDs are electrically connected to the substrate via the anisotropic conductive film, wherein each of the micro-LEDs comprises an epitaxial layer and an electrode layer electrically connected to the epitaxial layer, and the electrode layer comprises a first electrode and a second electrode which are located between the substrate and the epitaxial layer, wherein a ratio of a thickness of each of the electrode layers to a thickness of the corresponding epitaxial layer is in a range of 0.1 to 0.5, and a gap between the first electrode and the second electrode of each of the micro-LEDs is in a range of 1 µm to 30 µm.

2. The micro-LED display panel according to claim 1, wherein each of the epitaxial layers has a first surface and a second surface opposite to each other, each of the first electrodes and each of the second electrodes are disposed on the corresponding second surface, and each of the second surfaces faces the anisotropic conductive film.

3. The micro-LED display panel according to claim 2, wherein a part of the second surface of each of the micro-LEDs is adjacent to the anisotropic conductive film.

4. The micro-LED display panel according to claim 2, wherein a part of the second surface of each of the micro-LEDs contacts the anisotropic conductive film.

5. The micro-LED display panel according to claim 2, wherein each of the epitaxial layers comprises a first type semiconductor layer, a light emitting layer and a second type semiconductor layer, the first type semiconductor layer and the second type semiconductor layer are located at two opposite sides of the light emitting layer, and the light emitting layer connects the first type semiconductor layer and the second type semiconductor layer, wherein each of the first type semiconductor layers has the second surface, each of the first electrodes is electrically contacted with the corresponding second surface, and each of the second electrodes is electrically contacted with the corresponding second type semiconductor layer via a conductive hole and electrically isolated to the corresponding first type semiconductor layer.

6. The micro-LED display panel according to claim 5, wherein a ratio of a depth of one of the conductive holes to the thickness of the corresponding epitaxial layer is in a range of 0.15 to 0.35.

7. The micro-LED display panel according to claim 2, wherein a side length of each of the micro-LEDs is in a range of 3 μm to 100 μm.

8. The micro-LED display panel according to claim 2, wherein a ratio of the gap between the first electrode and the second electrode of each of the micro-LEDs to the side length of the micro-LED is in a range of 0.1 to 0.25.

9. The micro-LED display panel according to claim 2, wherein each of the epitaxial layers comprises a first type semiconductor layer, a second type semiconductor layer, and a light emitting layer connected to and disposed between the first type semiconductor layer and the second type semiconductor layer, wherein the second type semiconductor layer extends beyond the light emitting layer and the first type semiconductor layer in one of the micro-LEDs, the second surface has a first sub-surface and a second sub-surface separated from each other, the first type semiconductor layer has the first sub-surface, and an end of the second type semiconductor layer has the second sub-surface, wherein in one of the micro-LEDs, the first electrode is electrically contacted with the first sub-surface, and the second electrode is electrically contacted with the second sub-surface.

10. The micro-LED display panel according to claim 1, wherein the substrate comprises a plurality of pads, and the anisotropic conductive film covers the pads, and the electrode layers are electrically bonded to the pads respectively.

11. The micro-LED display panel according to claim 10, wherein at least one of the pads has a first thickness and at least another one of the pads has a second thickness, and the second thickness is greater than the first thickness.

12. The micro-LED display panel according to claim 10, wherein the anisotropic conductive film comprises an insulation film and a plurality of conductive particles dispersed in the insulation film, wherein a particle size of each of the conductive particles is smaller than the gap between the first electrode and the second electrode of one of the micro-LEDs, and a plurality of bonding layers are formed between the electrode layers and the pads and electrically connect the electrode layers and the pads respectively.

13. The micro-LED display panel according to claim 12, wherein at least one of the bonding layers has a first transmittance and at least another one of the bonding layers has a second transmittance, and the second transmittance is greater than the first transmittance.

14. The micro-LED display panel according to claim 12, wherein at least one of the bonding layers has a first thickness and at least another one of the bonding layers has a second thickness, and the second thickness is greater than the first thickness.

15. The micro-LED display panel according to claim 1, wherein the anisotropic conductive film comprises an insulation film and a plurality of conductive particles dispersed in the insulation film, and a ratio of a particle size of each of the conductive particles to a side length of each of the micro-LEDs is in a range of 0.1 to 0.2.

16. The micro-LED display panel according to claim 1, wherein the anisotropic conductive film comprises an insulation film and a plurality of conductive particles dispersed in the insulation film, and a particle size of each of the conductive particles is smaller than the gap between the first electrode and the second electrode of each of the micro-LEDs.

17. The micro-LED display panel according to claim 1, wherein a distance between one of the micro-LEDs and the substrate is different from a distance between another one of the micro-LEDs and the substrate.

* * * * *